(12) United States Patent
Wang et al.

(10) Patent No.: US 10,199,399 B2
(45) Date of Patent: Feb. 5, 2019

(54) DISPLAY SUBSTRATE AND MANUFACTURING METHOD THEREOF, AND DISPLAY APPARATUS

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Rui Wang, Beijing (CN); Haijun Qiu, Beijing (CN); Fei Shang, Beijing (CN); Jaikwang Kim, Beijing (CN); Shaoru Li, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/525,468

(22) PCT Filed: Jul. 22, 2016

(86) PCT No.: PCT/CN2016/091059
§ 371 (c)(1),
(2) Date: May 9, 2017

(87) PCT Pub. No.: WO2017/121089
PCT Pub. Date: Jul. 20, 2017

(65) Prior Publication Data
US 2018/0076223 A1    Mar. 15, 2018

(30) Foreign Application Priority Data
Jan. 15, 2016  (CN) .......................... 2016 1 0027413

(51) Int. Cl.
*H01L 21/00* (2006.01)
*H01L 27/00* (2006.01)
(Continued)

(52) U.S. Cl.
CPC ...... *H01L 27/124* (2013.01); *G02F 1/136227* (2013.01); *H01L 21/76802* (2013.01);
(Continued)

(58) Field of Classification Search
CPC ......... H01L 21/76802; H01L 21/76877; H01L 21/77; H01L 27/124; H01L 27/1262;
(Continued)

(56) References Cited

U.S. PATENT DOCUMENTS 6,879,358 B2 * 4/2005 Sato .................. G02F 1/136277
349/111
2010/0109008 A1  5/2010 Kim et al.
2012/0112200 A1  5/2012 Nagano

FOREIGN PATENT DOCUMENTS

CN     102023429 A    4/2011
CN     202159214 U    3/2012
(Continued)

OTHER PUBLICATIONS

International Search Report and Written Opinion dated Sep. 14, 2016; PCT/CN2016/091059.
(Continued)

*Primary Examiner* — Nikolay Yushin
(74) *Attorney, Agent, or Firm* — Ladas & Parry LLP (57) ABSTRACT

A display substrate, a display apparatus and a production method of the display substrate are provided. The display substrate includes a plurality of pixel units arranged in an array. Each of the pixel units includes: a first electrode; a first connection portion connected with the first electrode; and a first connection line, the first connection portion being
(Continued)

connected to the first connection line through a first via hole. The first connection line of at least one of the pixel units is connected with the first connection line of the pixel unit positioned on an upper side of the at least one of the pixel units and the first connection line of the pixel unit positioned on a lower side of the at least one of the pixel units.

20 Claims, 8 Drawing Sheets

(51) Int. Cl.
    *H01L 29/00*     (2006.01)
    *H01L 27/12*     (2006.01)
    *H01L 21/768*     (2006.01)
    *H01L 29/786*     (2006.01)
    *G02F 1/1362*     (2006.01)

(52) U.S. Cl.
    CPC .... *H01L 21/76877* (2013.01); *H01L 27/1262* (2013.01); *H01L 29/78633* (2013.01)

(58) Field of Classification Search
    CPC ............. H01L 27/127; H01L 29/78633; H01L 29/41733; H01L 29/786; G02F 1/136227; G02F 1/136213; G02F 1/136286
    See application file for complete search history.

(56) References Cited

FOREIGN PATENT DOCUMENTS

| | | |
|---|---|---|
| CN | 104201178 A | 12/2014 |
| CN | 104795405 A | 7/2015 |
| CN | 105489616 A | 4/2016 |

OTHER PUBLICATIONS

The First Chinese Office Action dated Dec. 29, 2017; Appln. No. 201610027413.8.

* cited by examiner

DISPLAY SUBSTRATE AND MANUFACTURING METHOD THEREOF, AND DISPLAY APPARATUS

TECHNICAL FIELD

Embodiments of the present disclosure relate to a display substrate, a display apparatus and a production method of the display substrate.

BACKGROUND

A display substrate includes a display region, and the display region includes a plurality of pixel units arranged in an array. A ratio of an area of a light-transmitting region of the pixel unit to an area of the entire pixel unit is called as an aperture ratio. By improving the aperture ratio, brightness of a display apparatus is improved and power consumption of a backlight unit is reduced.

SUMMARY

According to the embodiments of the disclosure, a display substrate is provided. The display substrate comprises a plurality of pixel units arranged in an array. Each of the pixel units includes: a first electrode; a first connection portion connected with the first electrode; and a first connection line, the first connection portion being connected to the first connection line through a first via hole; and the first connection line of at least one of the pixel units is connected with the first connection line of the pixel unit positioned on an upper side of the at least one of the pixel units and the first connection line of the pixel unit positioned on a lower side of the at least one of the pixel units.

For example, each of the pixel units further includes: a second connection portion and a third connection portion which are connected with the first electrode; the second connection portion of at least one of the pixel units is connected with the third connection portion of the pixel unit positioned on a left side of such at least one of the pixel units and the third connection portion of such at least one of the pixel units is connected with the second connection portion of the pixel unit positioned on a right side of such at least one of the pixel units.

For example, the first connection portion, the second connection portion and the third connection portion are arranged in a same layer.

For example, the display substrate further includes: a substrate, the first electrode being arranged on the substrate; and a gate line, arranged on the substrate, and the first connection portion, the second connection portion and the third connection portion are arranged in a same layer with the gate line.

For example, the display substrate further includes: a source and drain electrode layer, and the first connection line and the source and drain electrode layer are arranged in a same layer.

For example, the display substrate further includes: a second electrode, arranged above the source and drain electrode layer, and the first connection portion and the first connection line are arranged below an alignment chaotic region of the second electrode.

For example, the display substrate further includes: a passivation layer, arranged on the source and drain electrode layer, the first via hole is formed in the passivation layer at a position which corresponds to the first connection portion, and is configured for connecting the first connection portion and the first connection line; and the display substrate further includes: a shielding metal, arranged on the passivation layer at a position which corresponds to the first via hole.

For example, the display substrate further includes: a gate insulating layer, arranged on the gate line, and the first via hole is formed in the gate insulating layer at a position which corresponds to the first connection portion, and is configured for connecting the first connection portion and the first connection line.

For example, the second connection portion is connected with a left side edge of the first electrode, and the third connection portion is connected with a right side edge of the first electrode.

According to the embodiments of the disclosure, a display apparatus is provided. The display apparatus comprises the display substrate as described above.

According to the embodiments of the disclosure, a production method of a display substrate is provided. The display substrate comprises a plurality of pixel units arranged in an array. The method comprises: forming a first electrode on a substrate in each of the pixel units; forming a first connection portion connected with the first electrode on the first electrode in each of the pixel units; and forming a first connection line above the first connection portion in each of the pixel units, the first connection line of at least one of the pixel units being connected with the first connection line of the pixel unit positioned on an upper side of the at least one of the pixel units and the first connection line of the pixel unit positioned on a lower side of the at least one of the pixel units, the first connection line being connected with the first connection portion through a first via hole.

For example, the method further comprises: forming a second connection portion and a third connection portion on the first electrode in each of the pixel units, the second connection portion and the third connection portion being connected with the first electrode. The second connection portion of at least one of the pixel units is connected with the third connection portion of the pixel unit positioned on a left side of such at least one of the pixel units and the third connection portion of such at least one of the pixel units is connected with the second connection portion of the pixel unit positioned on a right side of such at least one of the pixel units.

For example, during the first connection portion is formed, the second connection portion and the third connection portion are formed.

For example, the method further comprises: forming a gate line on the substrate. During the gate line is formed, the first connection portion, the second connection portion and the third connection portion are formed.

For example, the method further comprises: forming a source and drain electrode layer on the gate line. During the source and drain electrode layer is formed, the first connection line is formed.

For example, the method further comprises: forming a second electrode with an alignment chaotic region above the source and drain electrode layer, the alignment chaotic region being positioned above the first connection portion and the first connection line.

For example, the method further comprises: forming a passivation layer on the source and drain electrode layer; forming the first via hole in the passivation layer at a position which corresponds to the first connection portion, so as to connect the first connection portion and the first connection line; and forming a shielding metal on the passivation layer at a position which corresponds to the first via hole.

For example, the method further comprises: forming a gate insulating layer on the gate line; and forming the first via hole in the gate insulating layer at a position which corresponds to the first connection portion, so as to connect the first connection portion and the first connection line.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

FIG. 1 to FIG. 4 are schematic views of a production process of a display substrate according to one technique. As shown in FIG. 1 to FIG. 4, a common electrode line 6a extends along a horizontal direction to connect common electrodes 1a arranged along the horizontal direction together, and a second connection portion 12a and a third connection portion 13a are arranged on the common electrode 1a. After a source and drain electrode layer 4a is formed, a second via hole 20a is formed at a position of the second connection portion 12a and a third via hole 30a is formed at a position of the third connection portion 13a; during a pixel electrode 5a is formed, a second connection line 53a is formed at a position of the second via hole 20a for connecting the common electrode 1a and a common electrode positioned on an upper side of the common electrode 1a, and a third connection line 54a is formed at a position of the third via hole 30a for connecting the common electrode 1a and a common electrode positioned on a lower side of the common electrode 1a. Thus, it can be seen that, two via holes are required for the purpose of connecting the common electrode 1a and the common electrodes adjacent to the common electrode 1a along a longitudinal direction, so that pixel electrodes positioned above the common electrodes need to give spaces for the two via holes, causing reduction of an aperture ratio of the display substrate.

Figure 6:
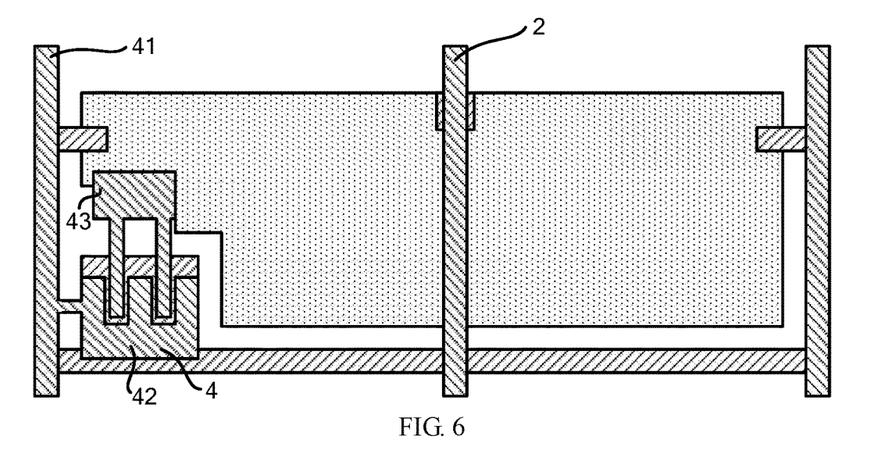
Figure 7:
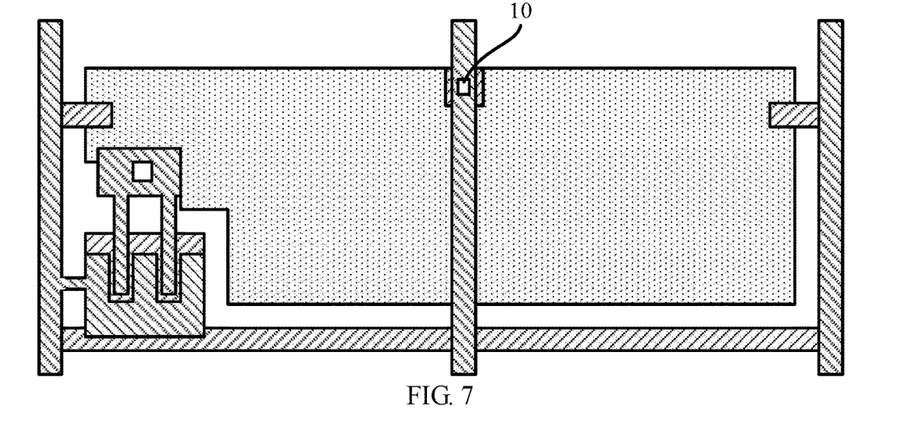
Figure 8:
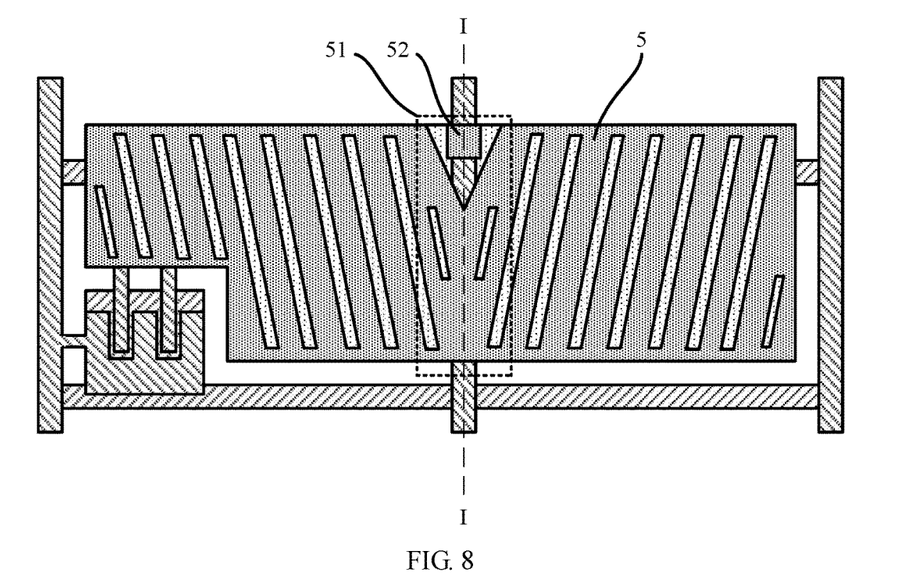
Figure 9:
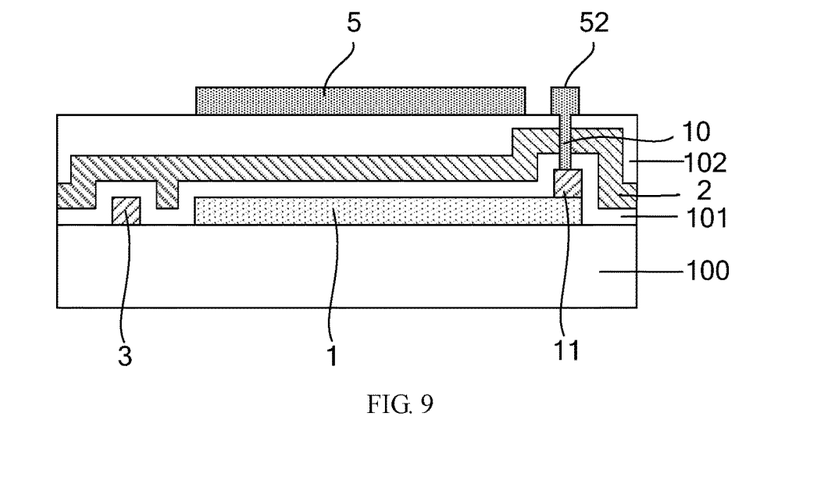
FIG. 9 is a sectional view taken along I-I line in FIG. 8.

FIG. 5 to FIG. 8 are schematic views of a production process of a display substrate according to the embodiments of the present disclosure, and FIG. 9 is a sectional view taken along I-I line in FIG. 8. With reference to FIG. 5 to FIG. 9, the display substrate includes a plurality of pixel units arranged in an array. The pixel unit each includes: a first electrode 1; a first connection portion 11 connected with the first electrode 1; and a first connection line 2, the first connection portion 11 being connected with the first connection line 2 through a first via hole 10, the first connection line 2 of at least one of the pixel units being connected with the first connection line of the pixel unit positioned on an upper side of the at least one of the pixel units and the first connection line of the pixel unit positioned on a lower side of the at least one of the pixel units.

For example, the first connection portion 11 is directly arranged on the first electrode 1 to be in contact with the first electrode 1.

For example, an insulating layer is arranged between the first connection line 2 and the first connection portion 11, and the first via hole 10 is formed in the insulating layer.

For example, the first connection line 2 of the pixel unit and the first connection line of the upper pixel unit positioned on the upper side of the pixel unit as well as the first connection line of the lower pixel unit positioned on the lower side of the pixel unit form a continuous straight line.

Figure 12:
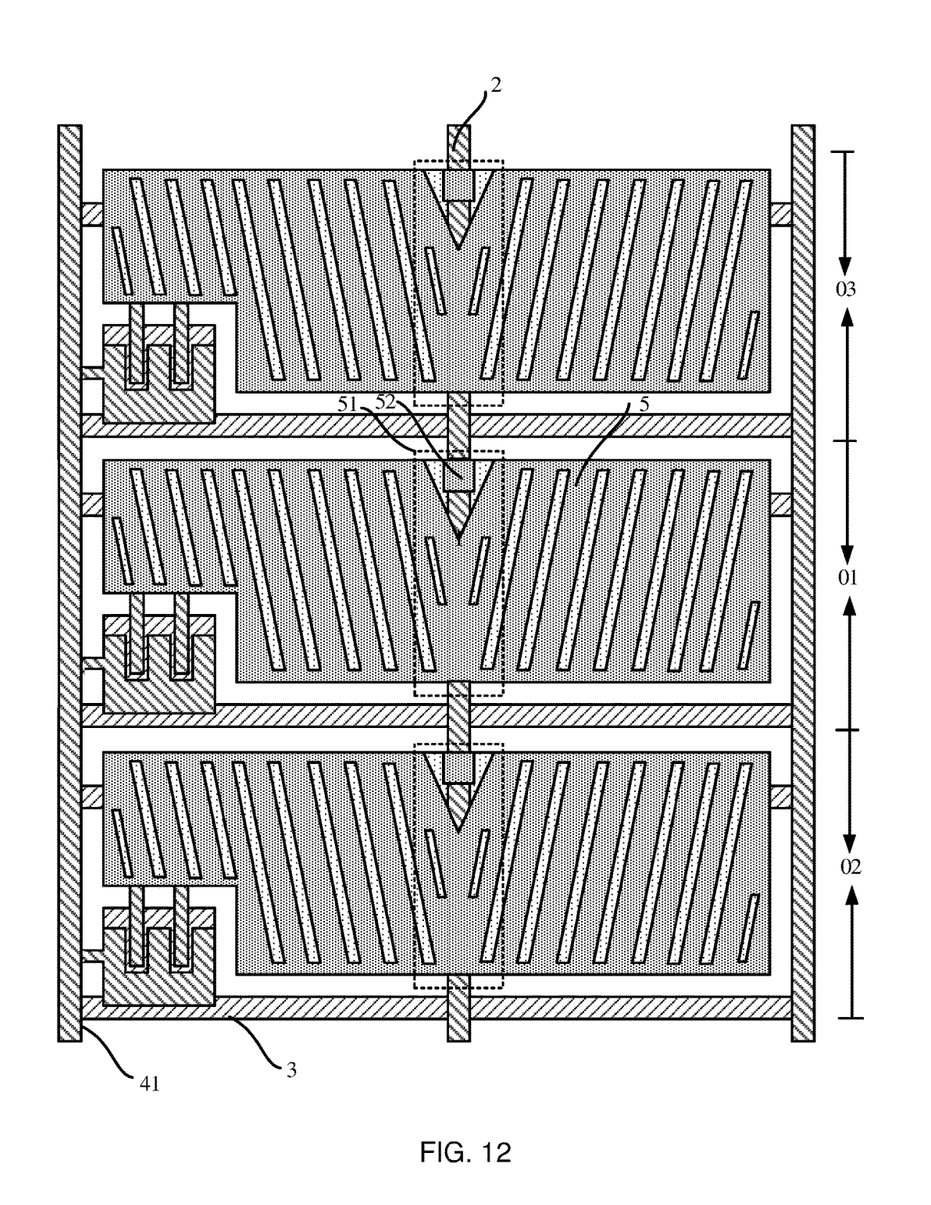
FIG. 12 is a plane schematic view of three pixel units, each of which has the structure shown in FIG. 8.

It should be noted that only one pixel unit is shown in FIG. 5 to FIG. 9, and at least part of pixel units of the display substrate are formed identically or similarly. For example, as shown in FIG. 12, three pixel units 01, 02 and 03 are shown, and each of the three pixel units 01, 02 and 03 has the structure shown in FIG. 8.

In the display substrate of the embodiments of the present disclosure, for example, the first electrode is a common electrode, the second electrode is a pixel electrode; or, for example, the first electrode is the pixel electrode, the second electrode is the common electrode. The embodiments of the present disclosure will be illustrated by taking the case that the first electrode is the common electrode and the second electrode is the pixel electrode as an example.

In the embodiments of the present disclosure, the first connection line 2 is connected with the first connection portion 11 through the first via hole 10 so as to be connected with the common electrode 1. The first connection line 2 is further connected with the first connection line of the upper pixel unit positioned on the upper side of the first connection line 2 and the first connection line of the lower pixel unit positioned on the lower side of the first connection line 2 so that the common electrodes in the pixel units arranged along the longitudinal direction are connected together. Compared to a case of connecting the common electrodes of the pixel units arranged along the longitudinal direction by two via holes 20a and 30a and two connection lines 53a and 54a in FIG. 1 to FIG. 4, the embodiments of the present disclosure only needs one via hole, so that the pixel electrode only needs to give a relatively small region for the via hole, thereby enlarging an effective light transmitting region and further improving the aperture ratio.

For example, the pixel unit each further includes: a second connection portion 12 and a third connection portion 13 connected with the first electrode 1. The second connection portion 12 of at least one of the pixel units is connected with the third connection portion of the pixel unit position on a left side of the at least one of the pixel units; and the third connection portion 13 of the at least one of the pixel units is connected with the second connection portion of the pixel unit on a right side of the at least one pixel units. For example, the second connection portion 12 of the pixel unit is connected with the third connection portion of the left pixel unit position on the left side of the pixel unit; and the third connection portion 13 of the pixel unit is connected with the second connection portion of the right pixel unit on the right side of the pixel unit.

For example, the second connection portion 12 is connected with a left side edge of the first electrode 1, the third connection portion 13 is connected with a right side edge of the first electrode 1 so as to facilitate connecting with the common electrode in the left pixel unit on the left side and the common electrode of the right pixel unit on the right side.

In the embodiments of the present disclosure, the common electrodes in the pixel units arranged along the horizontal direction are connected by the second connection portions 12 and the third connection portions 13, and compared to a case of carrying out connection by one common electrode line in FIG. 1 to FIG. 4, a wiring area is reduced, so that an area of a black matrix (BM) for shielding wirings is reduced, thereby further improving the aperture ratio. According to the embodiments of the present disclosure, for a display substrate with a 28 HD triple gate structure, the aperture ratio is increased to 66.7% from 63.6%.

Figure 1:
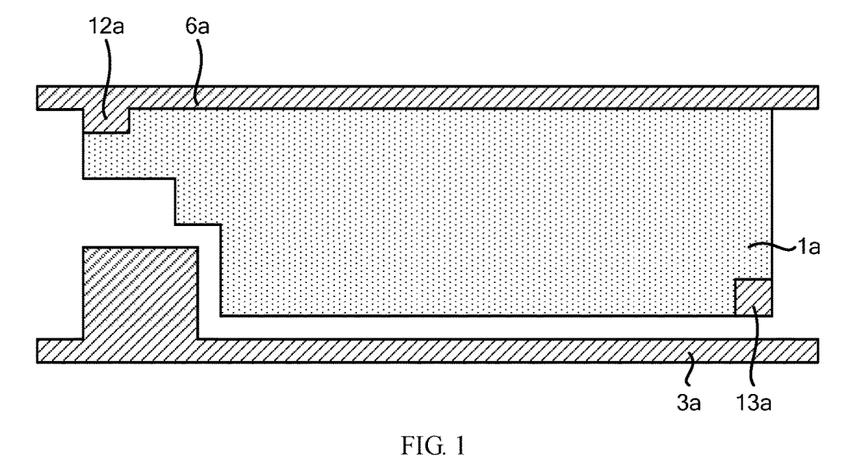
FIG. 1 to FIG. 4 show schematic views of a production process of a display substrate according to one technique.
Figure 2:
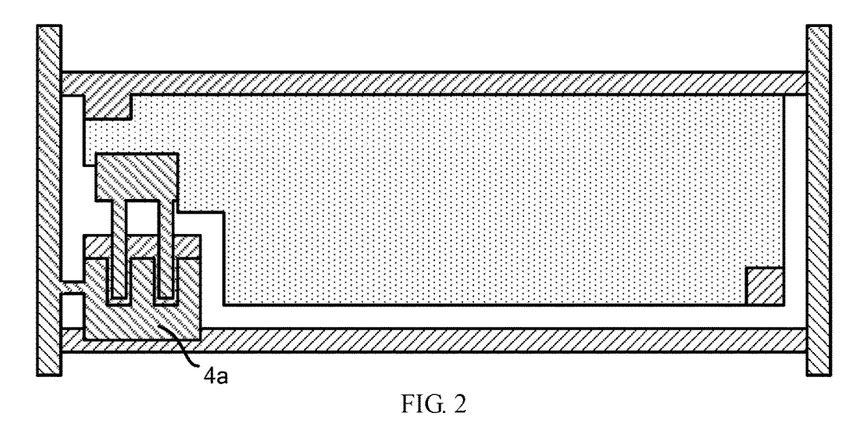
Figure 3:
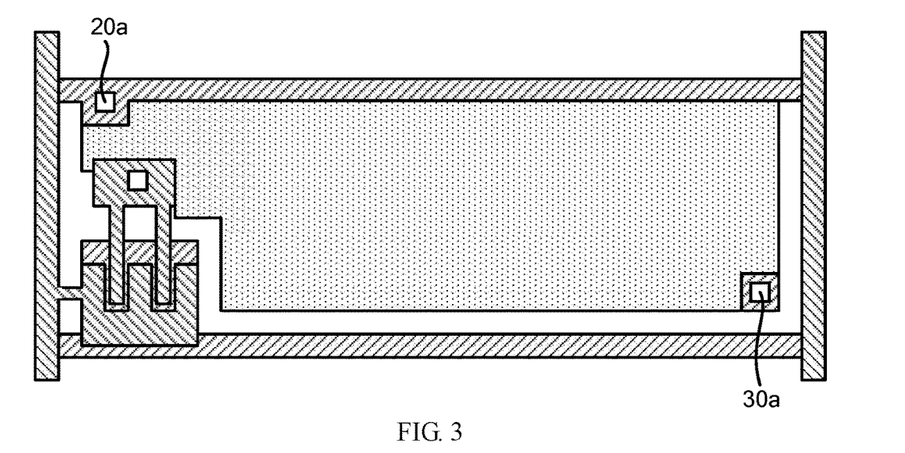
Figure 4:
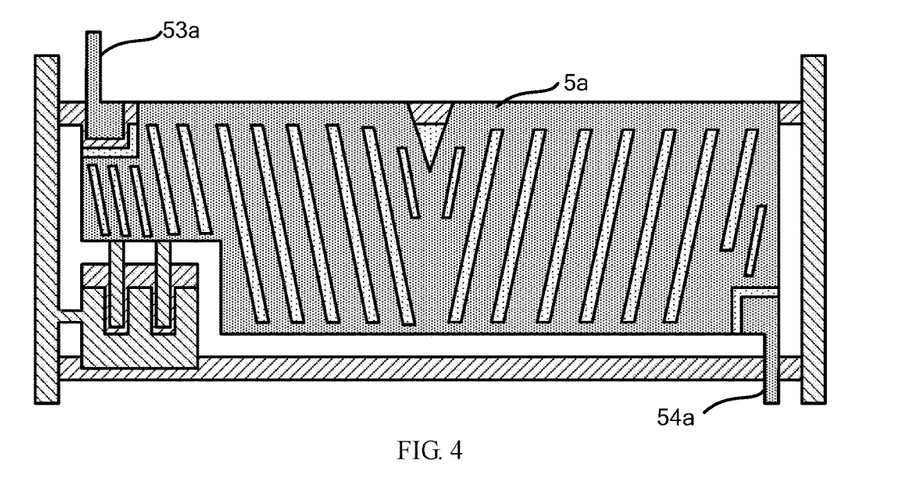
Figure 5:
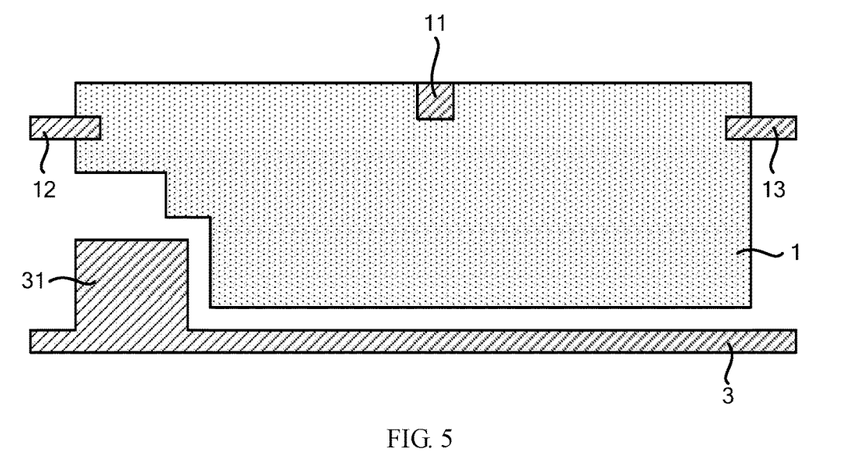
FIG. 5 to FIG. 8 show schematic views of a production process of a display substrate according to embodiments of the present disclosure.

For example, the first connection portion 11, the second connection portion 12 and the third connection portion 13 are arranged in a same layer. That is, the first connection portion 11, the second connection portion 12 and the third connection portion 13 are formed in a single patterning process so as to facilitate simplifying a production process of the display substrate.

For example, the pixel unit each includes a thin film transistor, the thin film transistor includes a gate electrode, a gate insulating layer, an active layer, a source electrode and a drain electrode, the gate electrode and a gate line are connected or integrally formed, the source electrode and a data line are connected or integrally formed, and the drain electrode is connected with the pixel electrode. For example, the display substrate further includes a substrate 100, and the first electrode 1, the gate line 3 and the gate electrode 31 are arranged on the substrate. For example, the first electrode 1, the gate line 3 and the gate electrode 31 are all in contact with the substrate 100, and the first electrode 1 is spaced apart from the gate line 3 and the gate electrode 31. For example, the first connection portion 11, the second connection portion 12 and the third connection portion 13 are arranged in the same layer with the gate line 3 and the gate electrode 31. That is, the gate line 3, the gate electrode 31, the first connection portion 11, the second connection portion 12 and the third connection portion 13 are formed in a single patterning process so as to facilitate simplifying the production process of the display substrate.

For example, the display substrate further includes: a source and drain electrode layer 4, the first connection line 2 and the source and drain electrode layer 4 are arranged in a same layer. For example, the source and drain electrode layer 4 includes a source electrode 42 of the thin film transistor, a drain electrode 43 of the thin film transistor and a data line 41. The source electrode 42 and the drain electrode 43 of the thin film transistor, the data line 41 and the first connection line 2 for example are formed in a single patterning process so as to facilitate simplifying the production process.

For example, the display substrate further includes: a second electrode 5 arranged above the source and drain electrode layer 4. It should be understood that an insulating layer, e.g., a passivation layer 102, for example is arranged between the second electrode 5 and the drain and source electrode layer 4.

For example, the first connection portion 11 and the first connection line 2 are arranged below an alignment chaotic region 51 of the second electrode 5. For example, the second electrode 5 includes a plurality of domains, electrodes in adjacent domains have different alignments, and an alignment chaotic region 51 is a boundary region between the adjacent domains.

The alignment chaotic region 51 of the second electrode 5 has a certain influence on transmittance, and thus, the first connection line 2 and the first connection portion 11 are arranged below the alignment chaotic region 51, and the first connection line 2 and the first connection portion 11 are shielded by the alignment chaotic region 51, so that the first connection line 2 and the first connection portion 11 have less influence on the transmittance. Further, the first connection line 2 and the first connection portion 11 do not need to be shielded by the black matrix, so that the aperture ratio is improved.

For example, the display substrate further includes: the passivation layer 102 arranged between the source and drain electrode layer 4 and the second electrode 5. The first via hole 10 is formed in the passivation layer 102 at a position which corresponds to the first connection portion 11, and configured for connecting the first connection portion 11 and the first connection line 2. In this case, for example, the first via hole 10 further penetrates through the gate insulating layer 10 positioned between the first electrode 1 and the first connection line 2.

For example, the display substrate further includes: a shielding metal 52 arranged on the passivation layer 102 at a position which corresponds to the first via hole 10.

By using the first via hole 10, connection of the first connection line 2 and the first connection portion 11 is ensured. For example, the shielding metal 52 is provided in a same layer with the pixel electrode 5. By forming the shielding metal 52 at the position of the first via hole 10, a material of the shielding metal 52 for example is arranged in the first via hole 10 so as to electrically connect the first connection line 2 and the first connection portion 11. In addition, by using the shielding metal 52, influence of other structures on the connection of the first connection line 2 and the first connection portion 11 is avoided.

Figure 10:
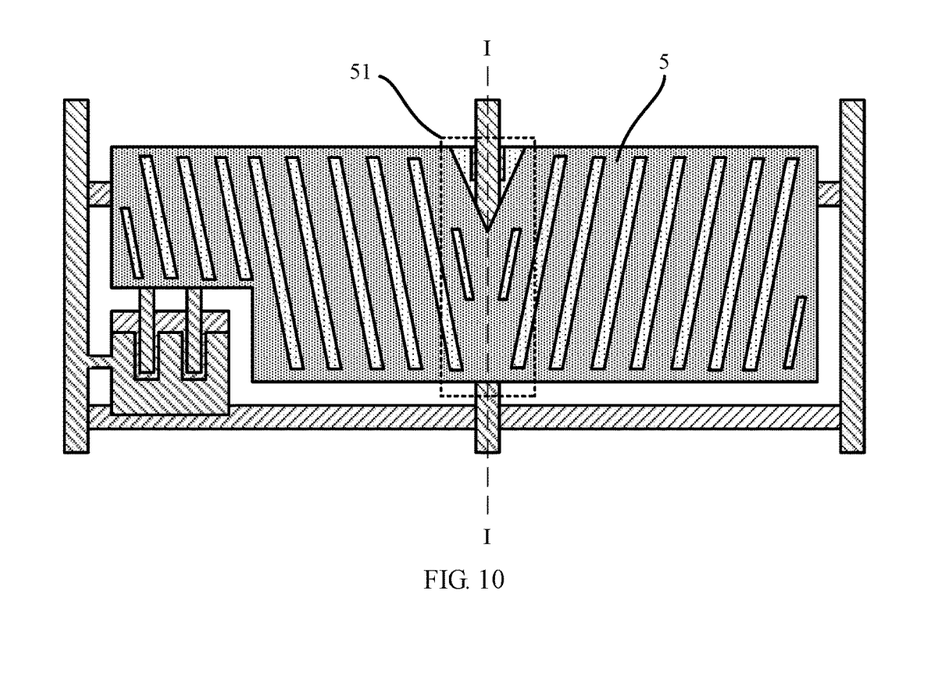
FIG. 10 is a plane schematic view of a display substrate according to the embodiments of the present disclosure.
Figure 11:
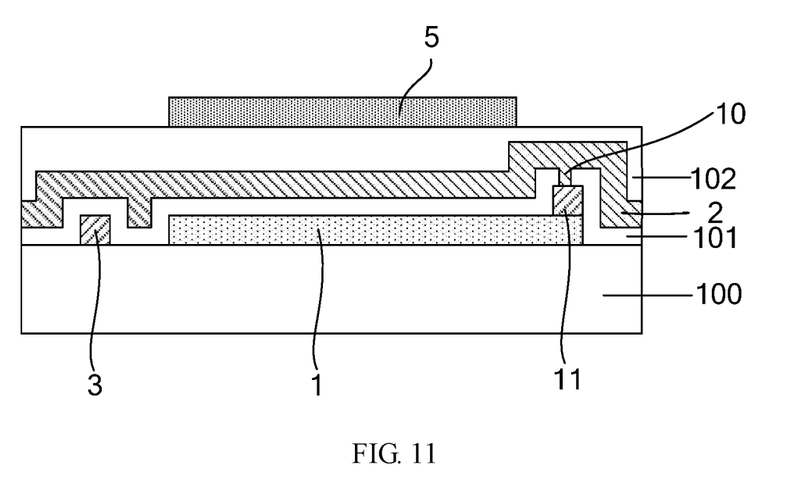
FIG. 11 is a sectional view taken along I-I line in FIG. 10.
Figure 13:
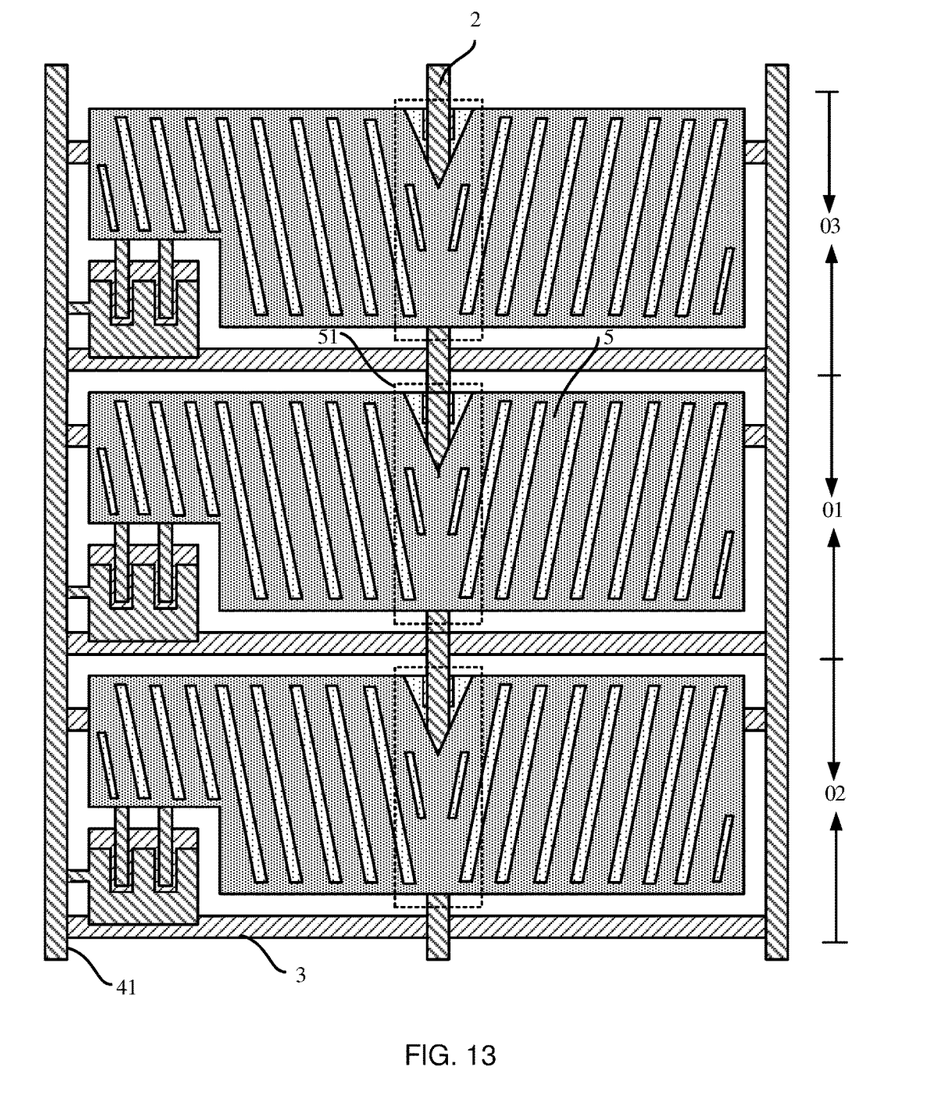
FIG. 13 is a plane schematic view of three pixel units, each of which has the structure shown in FIG. 10.

For example, with reference to FIG. 10 and FIG. 11, according to the embodiments of the present disclosure, the first via hole 10 is formed in the gate insulating layer 101, and in this case, the first via hole 10 is not disposed in the passivation layer 102. The first connection line 2 and the source and drain electrode layer 4 are formed in the same layer and are positioned on the gate insulating layer 10, and during the first connection line 2 is formed, a material of the first connection line 2 is arranged in the first via hole 10 so as to electrically connect the first connection line 2 and the first connection portion 11. In this case, the first connection line 2 and the passivation layer 102 directly shield the via hole, and thus, the shielding metal does not need to be additionally arranged to shield the via hole, and an area of the pixel electrode 5 can be further improved, so that the aperture ratio is further improved. It should be noted that only one pixel unit is shown in FIG. 10 and FIG. 11, and at least part of pixel units of the display substrate are formed identically or similarly. For example, as shown in FIG. 13, three pixel units 01, 02 and 03 are shown, and each of the three pixel units 01, 02 and 03 has the structure shown in FIG. 10.

The embodiments of the present disclosure further disclose a display apparatus, including the display substrate as described above.

It should be noted that the display apparatus in the embodiments of the present disclosure for example is any product or part with a display function, e.g., an electronic paper, a mobile phone, a tablet computer, a television, a notebook computer, a digital photo frame, a navigator and the like.

The embodiments of the present disclosure further disclose a production method of a display substrate, the display substrate comprises a plurality of pixel units. For example, the method includes:

Forming a first electrode 1 on a substrate in each of the pixel units;

Forming a first connection portion 11 connected with the first electrode on the first electrode in each of the pixel units, as shown in FIG. 5; and Forming a first connection line 2 above the first connection portion 11 in each of the pixel units, as shown in FIG. 6, the first connection line 2 of at least one of the pixel units being connected with the first connection line of the pixel unit positioned on an upper side of the at least one of the pixel units and the first connection line of the pixel unit positioned on a lower side of the at least one of the pixel units; the first connection line 2 being connected with the first connection portion 11 through a first via hole 10, as shown in FIG. 7 and FIG. 8.

For example, the method further includes:

Forming a second connection portion 12 and a third connection portion 13 on the first electrode 1 in each of the pixel units, the second connection portion 12 and the third connection portion 13 are connected with the first electrode 1. The second connection portion 12 of at least one of the pixel units is connected with the third connection portion of the pixel unit positioned on a left side of the at least one of the pixel units; and the third connection portion 13 of the at least one of the pixel units is connected with the second connection portion in the pixel unit positioned on a right side of the at least one of the pixel units.

For example, as shown in FIG. 5, during the first connection portion 11 is formed, the second connection portion 12 and the third connection portion 13 are formed.

For example, the method further includes: forming a gate line 3 on the substrate. For example, as shown in FIG. 5, during the gate line 3 is formed, the first connection portion 11, the second connection portion 12 and the third connection portion 13 are formed.

For example, the method further includes: forming a source and drain electrode layer 4 on the gate line 3. For example, as shown in FIG. 6, during the source and drain electrode layer 4 is formed, the first connection line 2 is formed.

For example, the method further includes: forming a second electrode 5 with an alignment chaotic region 51 on the source and drain electrode layer 4, the alignment chaotic region 51 being positioned above the first connection portion 11 and the first connection line 2, as shown in FIG. 8.

For example, the method further includes: forming a passivation layer 102 on the source and drain electrode layer 4. As shown in FIG. 7, the first via hole 10 is formed in the passivation layer 102 at a position which corresponds to the first connection portion 11.

For example, the method further includes: forming a shielding metal 52 on the passivation layer at a position which corresponds to the first via hole 10.

For example, the method further includes: forming a gate insulating layer 101 on the gate line 3. As shown in FIG. 11, the first via hole 10 is formed in the gate insulating layer 101 at a position which corresponds to the first connection portion 11.

For example, forming processes adopted in the embodiments of the disclosure include: film forming processes of deposition, sputtering and the like and patterning processes of etching and the like.

It should be noted that in the drawings, in order to make drawings clear, sizes of layers and regions are possibly exaggerated. It can be understood that when a component or layer is called to be "above" another component or layer, the component or layer can be directly on other components, or an intermediate layer can exist. In addition, it can be understood that when a component or layer is called to be "below" another component or layer, the component or layer can be directly under other components, or more than one intermediate layer or component can exist. In addition, it further can be understood that when a layer or component is called to be "between" two layers or two components, the layer or component can be a unique layer between two layers or two components, or more than one intermediate layer or component also can exist. Throughout the disclosure, similar reference signs denote similar components.

In the present disclosure, words such as "first", "second", "third" and "fourth" are only used for description, but should not be understood as denotation or suggestion on relative importance. The phrase "a plurality of" indicates that there are two or more than two, unless otherwise defined.

The foregoing embodiments merely are exemplary embodiments of the disclosure, and not intended to define the scope of the disclosure, and the scope of the disclosure is determined by the appended claims.

The present application claims priority of the Chinese Patent Application No. 201610027413.8 filed on Jan. 15, 2016, the disclosure of which are incorporated herein by its reference in its entirety as part of the present application.

The invention claimed is:

1. A display substrate, comprising a plurality of pixel units arranged in an array, wherein
    each of the pixel units includes: a first electrode; a first connection portion connected with the first electrode; and a first connection line, the first connection portion being connected to the first connection line through a first via hole; and
    the first connection line of at least one of the pixel units continuously extends across the at least one of the pixel units, is connected with and continuous with the first connection line of the pixel unit positioned on an upper side of the at least one of the pixel units and the first connection line of the pixel unit positioned on a lower side of the at least one of the pixel units.

2. A display apparatus, comprising the display substrate according to claim 1.

3. The display substrate according to claim 1, wherein the display substrate further includes a second electrode; and
    the second electrode and the first via hole do not overlap with each other in a direction perpendicular to the display substrate.

4. The display substrate according to claim 1, wherein the display substrate further includes: a source and drain electrode layer, and the first connection line and the source and drain electrode layer are arranged by a same layer.

5. The display substrate according to claim 4, wherein the display substrate further includes: a second electrode, arranged above the source and drain electrode layer, and
the first connection portion and the first connection line are arranged below an alignment chaotic region of the second electrode.

6. The display substrate according to claim 4, wherein the display substrate further includes: a passivation layer, arranged on the source and drain electrode layer,
the first via hole is formed in the passivation layer at a position which corresponds to the first connection portion, and is configured for connecting the first connection portion and the first connection line; and
the display substrate further includes: a shielding metal, arranged on the passivation layer at a position which corresponds to the first via hole.

7. The display substrate according to claim 1, wherein each of the pixel units further includes: a second connection portion and a third connection portion which are connected with the first electrode;
the second connection portion of at least one of the pixel units is connected with the third connection portion of the pixel unit positioned on a left side of such at least one of the pixel units and the third connection portion of such at least one of the pixel units is connected with the second connection portion of the pixel unit positioned on a right side of such at least one of the pixel units.

8. The display substrate according to claim 7, wherein the second connection portion is connected with a left side edge of the first electrode, and the third connection portion is connected with a right side edge of the first electrode.

9. The display substrate according to claim 7, wherein the first connection portion, the second connection portion and the third connection portion are arranged by a same layer.

10. The display substrate according to claim 9, wherein the display substrate further includes: a gate insulating layer, arranged on the gate line, and
the first via hole is formed in the gate insulating layer at a position which corresponds to the first connection portion, and is configured for connecting the first connection portion and the first connection line.

11. The display substrate according to claim 9, wherein the display substrate further includes: a substrate, the first electrode being arranged on the substrate; and a gate line, arranged on the substrate, and
the first connection portion, the second connection portion and the third connection portion are arranged by a same layer with the gate line.

12. A production method of a display substrate, the display substrate comprising a plurality of pixel units arranged in an array, wherein the method comprises:
forming a first electrode on a substrate in each of the pixel units;
forming a first connection portion connected with the first electrode on the first electrode in each of the pixel units; and
forming a first connection line above the first connection portion in each of the pixel units, the first connection line of at least one of the pixel units continuously extending across the at least one of the pixel units, and being connected with and continuous with the first connection line of the pixel unit positioned on an upper side of the at least one of the pixel units and the first connection line of the pixel unit positioned on a lower side of the at least one of the pixel units, the first connection line being connected with the first connection portion through a first via hole.

13. The method according to claim 12, further comprising: forming a second electrode, wherein, the second electrode and the first via hole do not overlap with each other in a direction perpendicular to the display substrate.

14. The method according to claim 12, further comprising:
forming a second connection portion and a third connection portion on the first electrode in each of the pixel units, the second connection portion and the third connection portion being connected with the first electrode,
wherein the second connection portion of at least one of the pixel units is connected with the third connection portion of the pixel unit positioned on a left side of such at least one of the pixel units and the third connection portion of such at least one of the pixel units is connected with the second connection portion of the pixel unit positioned on a right side of such at least one of the pixel units.

15. The method according to claim 14, wherein during the first connection portion is formed, the second connection portion and the third connection portion are formed.

16. The method according to claim 15, further comprising: forming a gate line on the substrate,
wherein during the gate line is formed, the first connection portion, the second connection portion and the third connection portion are formed.

17. The method according to claim 16, further comprising:
forming a gate insulating layer on the gate line; and
forming the first via hole in the gate insulating layer at a position which corresponds to the first connection portion, so as to connect the first connection portion and the first connection line.

18. The method according to claim 16, further comprising: forming a source and drain electrode layer on the gate line,
wherein during the source and drain electrode layer is formed, the first connection line is formed.

19. The method according to claim 18, further comprising:
forming a second electrode with an alignment chaotic region above the source and drain electrode layer, the alignment chaotic region being positioned above the first connection portion and the first connection line.

20. The method according to claim 18, further comprising:
forming a passivation layer on the source and drain electrode layer;
forming the first via hole in the passivation layer at a position which corresponds to the first connection portion, so as to connect the first connection portion and the first connection line; and
forming a shielding metal on the passivation layer at a position which corresponds to the first via hole.

* * * * *